(12) United States Patent
Kim

(10) Patent No.: US 9,100,016 B2
(45) Date of Patent: Aug. 4, 2015

(54) SEMICONDUCTOR CIRCUIT INCLUDING A CLOCK GATING CIRCUIT

(71) Applicant: SAMSUNG ELECTRONICS, CO., LTD., Suwon-si, Gyeonggi-do (KR)

(72) Inventor: Min-Su Kim, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 14/276,088

(22) Filed: May 13, 2014

(65) Prior Publication Data
US 2015/0048876 A1 Feb. 19, 2015

(30) Foreign Application Priority Data
Aug. 14, 2013 (KR) .................. 10-2013-0096696

(51) Int. Cl.
*H03K 17/00* (2006.01)
*H03K 17/284* (2006.01)

(52) U.S. Cl.
CPC ...... *H03K 17/284* (2013.01); *H03K 2217/0054* (2013.01)

(58) Field of Classification Search
USPC ........... 327/365, 392, 393, 398, 400; 716/133
See application file for complete search history.

(56) References Cited

U.S. PATENT DOCUMENTS

| | | | |
|---|---|---|---|
| 6,204,695 B1 * | 3/2001 | Alfke et al. ................... | 326/93 |
| 6,987,404 B2 | 1/2006 | Duncan | |
| 7,676,778 B2 | 3/2010 | Arbel et al. | |
| 7,880,498 B2 | 2/2011 | Habel et al. | |
| 7,962,883 B2 | 6/2011 | Kitahara et al. | |
| 8,055,965 B2 | 11/2011 | Kaneko | |
| 8,127,188 B2 | 2/2012 | Hawegawa | |
| 8,132,144 B2 | 3/2012 | Sundaresan et al. | |
| 8,656,326 B1 * | 2/2014 | Rahim et al. ............... | 716/104 |
| 2008/0046771 A1 * | 2/2008 | Hsu .............................. | 713/401 |
| 2008/0301604 A1 | 12/2008 | Itskovich et al. | |
| 2010/0033229 A1 * | 2/2010 | Irie .............................. | 327/365 |

FOREIGN PATENT DOCUMENTS

| | | |
|---|---|---|
| JP | 2006-3249 A | 1/2006 |
| JP | 2012-108846 A | 6/2012 |
| KR | 10-0333663 B1 | 4/2002 |

* cited by examiner

*Primary Examiner* — William Hernandez
(74) *Attorney, Agent, or Firm* — Sughrue Mion, PLLC

(57) ABSTRACT

Provided is a semiconductor circuit. The semiconductor circuit includes: an input node configured to receive an enable signal, scan enable signal, and a clock signal; and a clock gating circuit configured to output an enable clock signal corresponding to the clock signal while a signal level of the enable signal is at a first level regardless of a signal level of the scan enable signal, when the semiconductor circuit is in a high-voltage mode, and output an enable clock signal corresponding to the clock signal while a signal level of at least one of the enable signal and the scan enable signal is at the first level, when the semiconductor circuit is in a low-voltage mode.

20 Claims, 14 Drawing Sheets

1000

1100

1200

SEMICONDUCTOR CIRCUIT INCLUDING A CLOCK GATING CIRCUIT

CROSS-REFERENCE TO RELATED APPLICATION

This application claims priority from Korean Patent Application No. 10-2013-0096696 filed on Aug. 14, 2013 in the Korean Intellectual Property Office, the disclosure of which is incorporated herein in its entirety by reference.

BACKGROUND

1. Field

The present invention relates to a semiconductor circuit.

2. Description of the Related Art

In a semiconductor circuit, there is a case in which a clock is provided or an interruption circuit is required for purposes such as power saving, and the like. A clock gating circuit is used not to provide the clock to a specific circuit when an operation of the specific circuit is not required.

SUMMARY

The inventive concept and its exemplary embodiments provide a semiconductor circuit having improved operational reliability.

The effects of the inventive concept are not limited to the aforementioned effects, and other effects, which are not mentioned above, will be apparently understood by the person skilled in the art from the recitations of the claims.

According to an aspect of an exemplary embodiment, there is provided a semiconductor circuit which may include: an input node configured to receive an enable signal, a scan enable signal, and a clock signal; and a clock gating circuit configured to output an enable clock signal corresponding to the clock signal while a signal level of the enable signal is at a first level regardless of a signal level of the scan enable signal, when the semiconductor circuit is in a high-voltage mode, and output an enable clock signal corresponding to the clock signal while a signal level of at least one of the enable signal and the scan enable signal is at the first level, when the semiconductor circuit is in a low-voltage mode.

According to an aspect of another exemplary embodiment, there is provided a semiconductor circuit which may include: a clock gating cell; and a delay unit configured to delay an enable signal by a first time and provide the delayed signal to the clock gating cell in a high-voltage mode and delay the enable signal by a second time longer than the first time and provide the delayed signal to the clock gating cell in a low-voltage mode.

According to an aspect of still another exemplary embodiment, there is provided a semiconductor circuit including a clock gating circuit which may include: a first logic gate to which an enable signal and a low-voltage mode signal are input for operation; and a second logic gate to which the enable signal and a scan enable signal are input for operation, wherein the clock gating circuit outputs an enable clock signal of a first level according to a clock signal of the clock gating circuit regardless of a signal level of the scan enable signal input to the second logic gate, if the low-voltage mode signal of a second level, opposite to the first level, is input to the first logic gate, and wherein the clock gating circuit outputs the enable clock signal of the first level according to the clock signal if the low-voltage mode signal of the first level is input to the first logic gate and at least one of the enable signal having the first level and the scan enable signal having the first level is input to the first logic gate and the second logic gate, respectively.

BRIEF DESCRIPTION OF THE DRAWINGS

The above and other features and advantages will become more apparent by describing in detail exemplary embodiments thereof with reference to the attached drawings, in which.

DETAILED DESCRIPTION OF THE EXEMPLARY EMBODIMENTS

Figure 1:
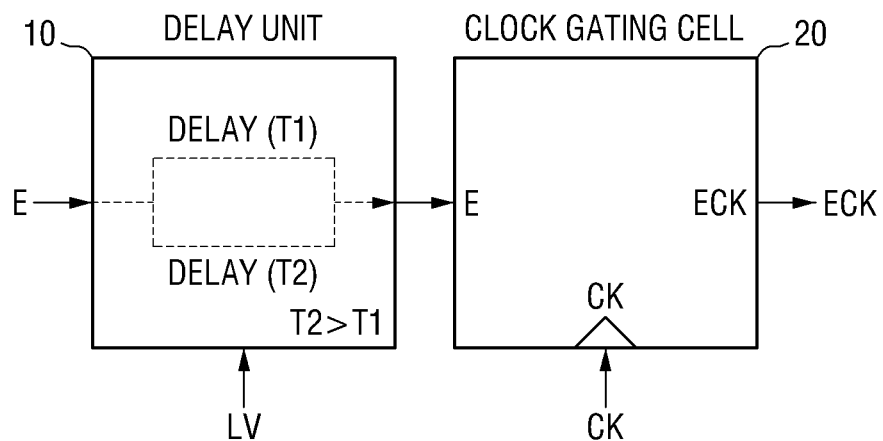
FIG. 1 is a conceptual block diagram of a semiconductor circuit according to an exemplary embodiment.

Advantages and features of the inventive concept and methods of accomplishing the same may be understood more readily by reference to the following detailed description of exemplary embodiments and the accompanying drawings. The inventive concept may, however, be embodied in many different forms and should not be construed as being limited to the embodiments set forth herein. Rather, these embodiments are provided so that this disclosure will be thorough and complete and will fully convey the inventive concept to those skilled in the art, and the invention concept will only be defined by the appended claims. Like reference numerals refer to like elements throughout the specification.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on", "directly connected to" or "directly coupled to" another element or layer, there are no intervening elements or layers present. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concept.

Spatially relative terms, such as "beneath", "below", "lower", "above", "upper", and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Exemplary embodiments are described herein with reference to cross-section illustrations that are schematic illustrations of idealized embodiments (and intermediate structures). As such, variations from the shapes of the illustrations as a result, for example, of manufacturing techniques and/or tolerances, are to be expected. Thus, these embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the inventive concept.

Unless otherwise defined, all terms (including technical and scientific terms) used herein have the same meaning as commonly understood by one of ordinary skill in the art to which the inventive concept belongs. It will be further understood that terms, such as those defined in commonly used dictionaries, should be interpreted as having a meaning that is consistent with their meaning in the context of the relevant art and this specification and will not be interpreted in an idealized or overly formal sense unless expressly so defined herein.

FIG. 1 is a conceptual block diagram of a semiconductor circuit according to an exemplary embodiment. The semiconductor circuit according to the present embodiments and the other exemplary embodiments described hereinafter is a clock gating circuit, but the inventive concept is not limited thereto.

Referring to FIG. 1, the semiconductor circuit 1 includes a delay unit 10 and a clock gating cell 20. Herein, the delay unit 10 and the clock gating cell 20 may constitute the clock gating circuit.

The delay unit 10 delays an enable signal E by a first time T1 and provides the delayed enable signal E to the clock gating cell 20, in a high-voltage mode. The delay unit 10 delays the enable signal E by a second time T2 longer than the first time T1 and provides the delayed enable signal E to the clock gating cell 20, in a low-voltage mode.

According to an exemplary embodiment, when the semiconductor circuit 1 operates in the high-voltage mode, a signal level of a low-voltage mode signal LV may be a first level (for example, a logic low level, hereinafter, referred to as "L"), and, when the semiconductor circuit 1 operates in the low-voltage mode, the signal level of the low-voltage mode signal LV may be a second level (for example, a logical high level, hereinafter, referred to as "H"). Alternatively, when the signal level of the low-voltage mode signal LV may be the first level L, the semiconductor circuit 2 may operate in the high-voltage mode, and when the signal level of the low-voltage mode signal LV may be the second level H, the semiconductor circuit 2 may operate in the low-voltage mode. In any case, in FIG. 1, when the semiconductor circuit 1 operates in the high-voltage mode and the low-voltage mode signal LV is at the first level L, the delay unit 10 delays the enable signal E by the first time T1 to provide the enable signal E to the clock gating cell 20, and when the semiconductor circuit 1 operates in the low-voltage mode and the low-voltage mode signal LV is at the second level H, the delay unit 10 delays the enable signal E by the second time T2 to provide the enable signal E to the clock gating cell 20.

The term "first level" and "second level" are used herein to distinguish two signal levels. Thus, the first level may be a logical high level H while the second level may be a logical low level L. Hereinafter, semiconductor circuits according to the exemplary embodiments will be described for a case in which a signal level of a specific signal is, for example, a voltage level of the specific signal, as an example. However, the inventive concept is not limited thereto, and, unlike this, an aspect of the signal level may be modified in any degree. For example, in some other embodiments, the signal level of the specific signal may be modified and applied to, for example, a current level of the specific signal.

The clock gating cell 20 receives an output of the delay unit 10, and may generate and output an enable clock signal ECK based on a clock signal CK received while the output of the delay unit 10 is at the second level H.

In the semiconductor circuit 1 according to the present embodiment, an enable signal E which is minimally delayed is provided to the clock gating cell 20 to perform a rapid clock gating operation, in the high-voltage mode in which an operating speed is high. However, in the low-voltage mode in which the operating speed is low, a comparatively large hold margin is required, and thus, only when a hold time is sufficiently secured, it is possible to stably perform the clock gating operation. Therefore, in the semiconductor circuit 1 according to the present embodiment, an enable signal E in which the delay is further increased than in the high-voltage mode is provided to the clock gating cell 20 to perform a stable clock gating operation, in the low-voltage mode in which the operating speed is low. As a result, an operational reliability of the semiconductor circuit 1 may be improved.

Figure 2:
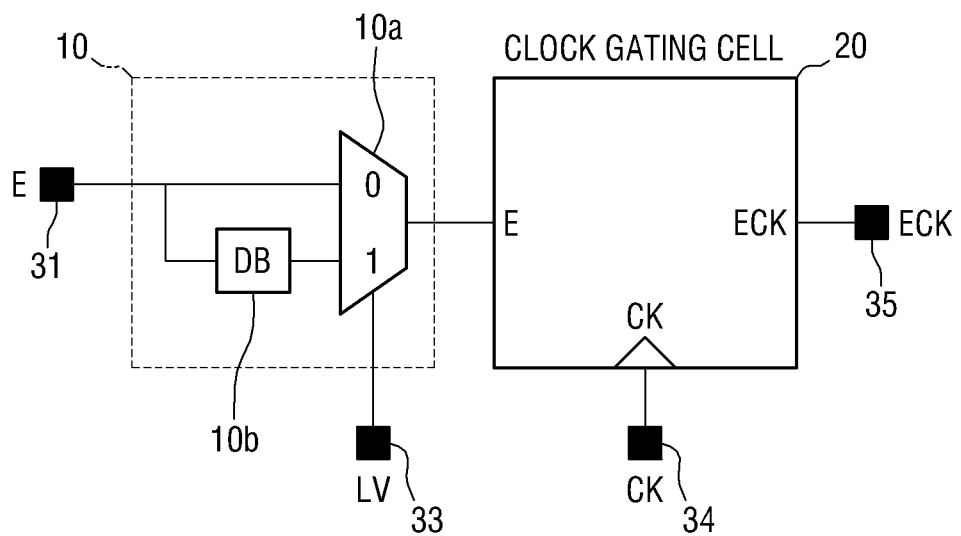
FIG. 2 is a detailed block diagram of a semiconductor circuit according to an exemplary embodiment.

FIG. 2 is a detailed block diagram of a semiconductor circuit according to an exemplary embodiment. The semiconductor circuit 1 illustrated in FIG. 2 may be the same semiconductor circuit illustrated in FIG. 1. However, the present inventive concept is not limited to the embodiment illustrated in FIG. 2.

Referring to FIG. 2, the delay unit 10 may include a signal selecting unit 10a and a delay buffer 10b.

An enable signal E provided to a first input node 31 may be a first input of the signal selecting unit 10a. The enable signal E may be delayed at the delay buffer 10b to be a second input of the signal selecting unit 10a.

According to an exemplary embodiment, the signal selecting unit 10a may be a multiplexer that performs multiplexing according to a signal level of the low-voltage mode signal LV provided to a third input node 33.

In detail, in the high-voltage mode in which the signal level of the low-voltage mode signal LV is the first level L, the enable signal E may be provided to the clock gating cell 20 without a delay. However, in the low-voltage mode in which the signal level of the low-voltage mode signal LV is the second level H, the enable signal E may be delayed through a delay buffer 10b and thereafter, provided to the clock gating cell 20.

Although only one delay buffer 10b is illustrated in FIG. 2, the inventive concept is not limited thereto and the number of delay buffers 10b may be increased.

The clock gating cell 20 generates the enable clock signal ECK corresponding to a clock signal CK provided from a fourth input node 34 to output the generated enable clock signal ECK to an output node 35 while an output provided from the delay unit 10 is at the second level H.

In the semiconductor circuit 1 according to the above embodiment, the operational reliability 1 may be improved as described above.

Figure 3:
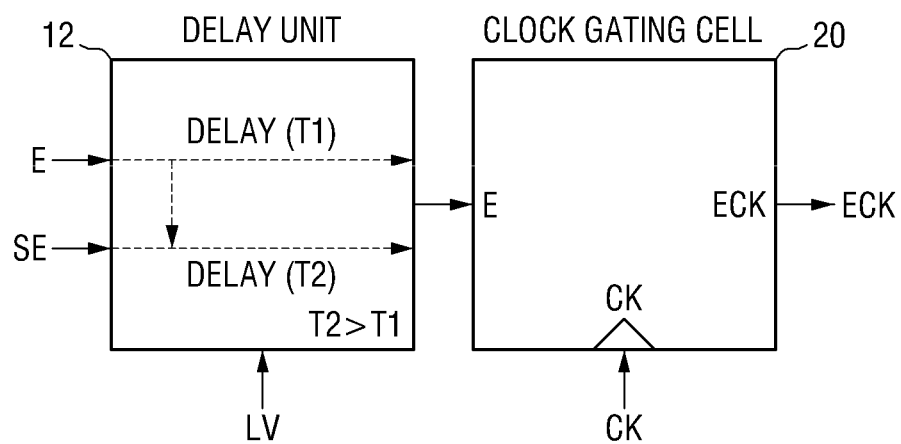
FIG. 3 is a conceptual block diagram of a semiconductor circuit according to another exemplary embodiment.

FIG. 3 is a conceptual block diagram of a semiconductor circuit according to another exemplary embodiment.

Referring to FIG. 3, a semiconductor circuit 2 includes a delay unit 12 and a clock gating cell 20. Herein, the delay unit 12 and the clock gating cell 20 may constitute a clock gating circuit.

The delay unit 12 delays an enable signal E by a first time T1 to provide the delayed enable signal E to the clock gating cell 20, in a high-voltage mode. In addition, the delay unit 10 delays a logical operation signal (for example, LS of FIG. 4) generated by logically operating the enable signal E and a scan enable signal SE by the second time T2 longer than the first time T1 to provide the delayed logical operation signal to the clock gating cell 20, in the low-voltage mode.

According to an exemplary embodiment, when the semiconductor circuit 2 operates in the high-voltage mode, the signal level of the low-voltage mode signal LV may be the first level L. In addition, when the semiconductor circuit 2 operates in the low-voltage mode, the signal level of the low-voltage mode signal LV may be the second level H. That is, in FIG. 3, when the semiconductor circuit 2 operates in the high-voltage mode to be at the first level L which is the signal level of the low-voltage mode signal LV, the delay unit 12 delays the enable signal E by the first time T1 to provide the enable signal E to the clock gating cell 20, and when the semiconductor circuit 2 operates in the low-voltage mode to be at the second level H which is the signal level of the low-voltage mode signal LV, the delay unit 12 delays at least one of the enable signal E and the scan enable signal SE by the second time T2 to provide the delayed signal to the clock gating cell 20.

The clock gating cell 20 receives an output of the delay unit 12, and may generate and output an enable clock signal ECK from a clock signal CK received while the output of the delay unit 12 is at the second level H.

Figure 4:
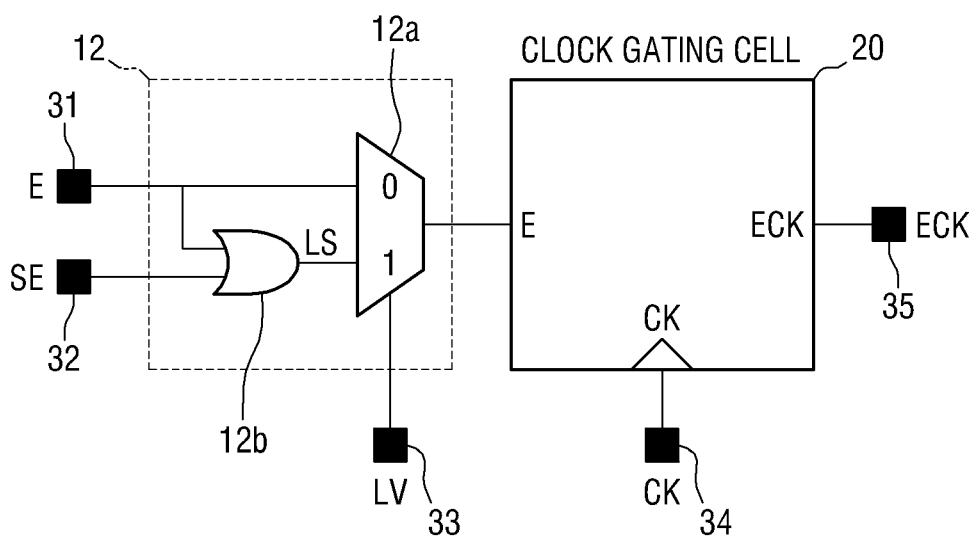
FIG. 4 is a detailed block diagram of a semiconductor circuit according to another embodiment.

FIG. 4 is a detailed block diagram of a semiconductor circuit according to another exemplary embodiment. The semiconductor circuit 2 illustrated in FIG. 4 may be the same semiconductor circuit illustrated in FIG. 3. However, the inventive concept is not limited to the embodiment illustrated in FIG. 4.

Referring to FIG. 4, the delay unit 12 may include a signal selecting unit 12a and a logical operation unit 12b.

An enable signal E provided to a first input node 31 may be a first input of the signal selecting unit 12a. The logical operation signal LS output by the logical operation unit 12b may be a second input of the signal selecting unit 12a.

According to an exemplary embodiment, the signal selecting unit 12a may be, for example, a multiplexer that performs multiplexing according to the signal level of the low-voltage mode signal LV provided to a third input node 33.

The logical operation unit 12b logically operates the enable signal E provided to the first input node 31 and the scan enable signal SE provided to the second input node 32 to generate the logical operation signal LS based thereon. According to an exemplary embodiment, the logical operation unit 12b may include an OR gate as illustrated in FIG. 4.

The clock gating cell 20 generates the enable clock signal ECK corresponding to the clock signal CK provided from the fourth input node 34 to output the generated enable clock signal ECK to an output node 35 while the output provided from the delay unit 12 is at the second level H.

An operation of the semiconductor circuit 2 illustrated in FIG. 4 will be described below.

First, when the semiconductor circuit 2 operates in the high-voltage mode, that is, when the signal level of the low-voltage mode signal LV is the first level L, the enable signal E is provided to the clock gating cell 20 without a delay. Therefore, the clock gating cell 20 may generate the enable clock signal ECK to correspond to the clock signal CK provided to the fourth input node 34 and output the generated enable clock signal ECK to the output node 35 while the enable signal E is at the second level H regardless of a signal level of the scan enable signal SE.

Next, when the semiconductor circuit 2 operates in the low-voltage mode, that is, when the signal level of the low-voltage mode signal LV is the second level H, the operation of the semiconductor circuit 2 may be divided into a normal operation and a scan operation.

First, in the normal operation in which the signal level of the scan enable signal SE is the first level L, the enable signal E is delayed by the logical operation unit 12b to be provided to the clock gating cell 20. Therefore, the clock gating cell 20 may generate the enable clock signal ECK to correspond to the clock signal CK provided to the fourth input node 34 and output the generated enable clock signal ECK to the output node 35 while the enable signal E is at the second level H.

Next, in the scan operation in which the signal level of the scan enable signal SE is the second level H, the signal level of the logical operation signal LS output by the logical operation unit 12b is continuously the second level H regardless of the signal level of the enable signal E. Therefore, the clock gating cell 20 may create the enable clock signal ECK to correspond to the clock signal CK provided to the fourth input node 34 and output the created enable clock signal ECK to the output node 35 while the scan enable signal SE is at the second level H. In other words, the clock gating cell 20 may perform a scan shift operation.

As such, in the semiconductor circuit 2 according to the above embodiment, the enable signal E which is minimally delayed is provided to the clock gating cell 20 to perform a rapid clock gating operation, in the high-voltage mode in which an operating speed is high.

However, in the normal operation of a low-voltage mode in which the operating speed is low, an enable signal E in which a delay is further increased than in the high-voltage mode is provided to the clock gating cell 20 to increase a hold time, thereby performing a stable clock gating operation.

Last, in the scan operation of the low-voltage mode in which the operating speed is low, the clock gating cell 20 may perform the scan shift operation regardless of the enable signal E.

That is, the semiconductor circuit 2 may operate with reliability regardless of an operating voltage of the semiconductor circuit 2.

Figure 5:
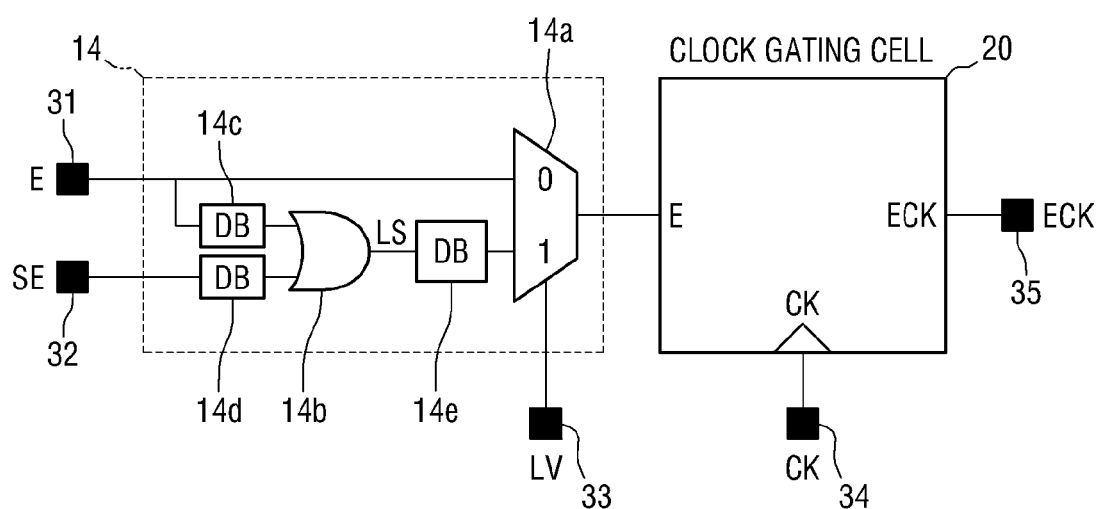
FIG. 5 is a detailed block diagram of a semiconductor circuit according to yet another exemplary embodiment.

FIG. 5 is a detailed block diagram of a semiconductor circuit according to yet another exemplary embodiment. Hereinafter, a description which is duplicated with the aforementioned embodiments will be omitted and a difference therebetween will be primarily described.

Referring to FIG. 5, a delay unit 14 of the semiconductor circuit 3 may include a signal selecting unit 14a, a logical operation unit 14b, and delay buffers 14c to 14e.

The signal selecting unit 14a may be, for example, a multiplexer that performs multiplexing according to the signal level of the low-voltage mode signal LV provided to the third input node 33.

The logical operation unit 14b logically operates the enable signal E provided to the first input node 31 and the scan enable signal SE provided to the second input node 32 to generate the logical operation signal LS based thereon. According to an exemplary embodiment, the logical operation unit 14b may include the OR gate as illustrated in FIG. 5.

The delay buffers 14c to 14e may be connected to at least one of an input terminal or an output terminal of the logical operation unit 14b. For example, for example, the delay buffers 14c to 14e are respectively connected to all input terminals and output terminals of the logical operation unit 14b in FIG. 5, but the inventive concept is not limited thereto. That is, the number of delay buffers 14c to 14e may be modified.

For example, in other exemplary embodiments, the delay buffers 14c to 14e may be modified to be connected to only the input terminal of the logical operation unit 14b. Further, for example, in yet other exemplary embodiments, the delay buffers 14c to 14e may be modified to be connected to only the output terminal of the logical operation unit 14b.

As such, when the delay buffers 14c to 14e are added to the semiconductor circuit 3, the delay time may further be increased, and as a result, the hold time may be further increased, in the low-voltage mode.

Figure 6:
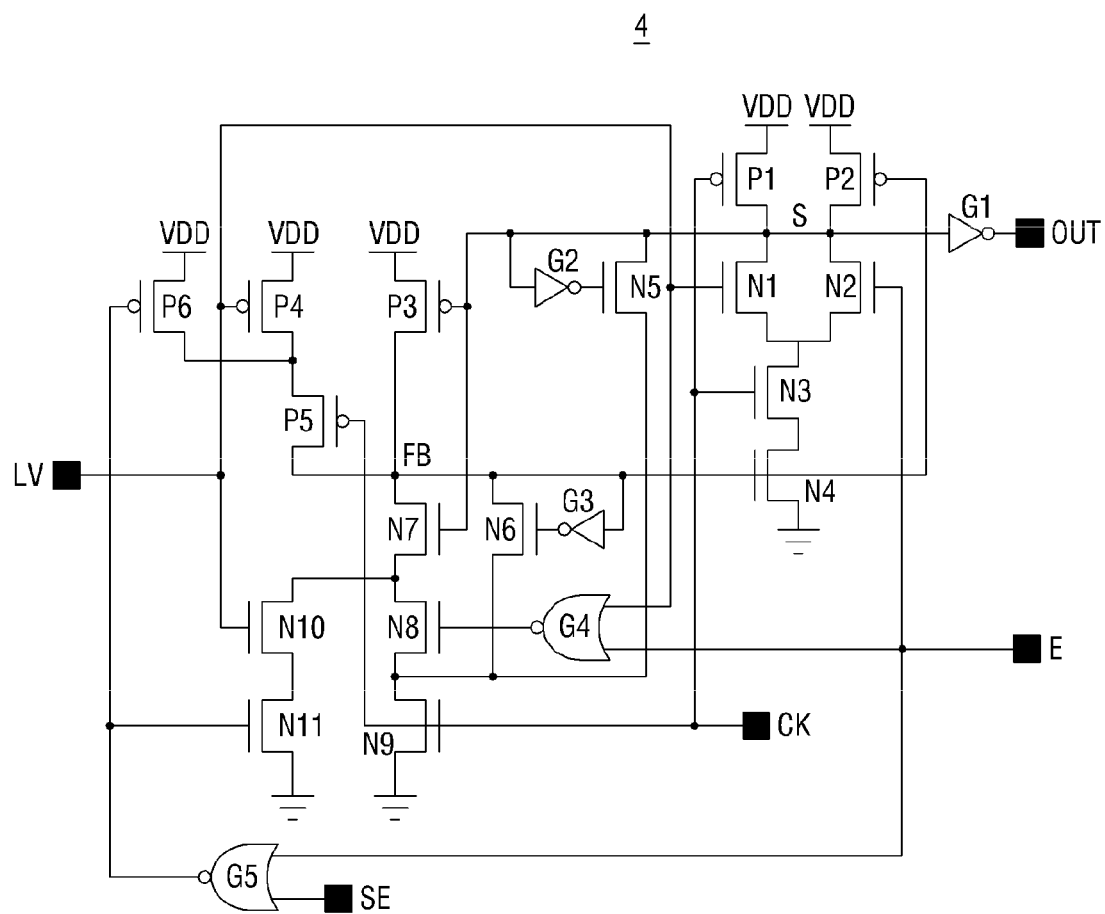
FIG. 6 is a circuit diagram of a semiconductor circuit according to still another exemplary embodiment.

FIG. 6 is a circuit diagram of a semiconductor circuit according to still another exemplary embodiment.

Referring to FIG. 6, the semiconductor circuit 4 includes first to sixth PMOS transistors P1 to P6, first to eleventh NMOS transistors N1 to N11, and first to fifth logical gates G1 to G5.

The first PMOS transistor P1 is gated by the signal level of the clock signal CK to provide power voltage VDD to a sensing node S. The second PMOS transistor P2 is gated by a voltage level of a feedback node FB to provide the power voltage VDD to the sensing node S.

The third PMOS transistor P3 is gated by a voltage level of the sensing node S to provide the power voltage VDD to the feedback node FB. The fourth PMOS transistor P4 is gated by the signal level of the low-voltage mode signal LV to provide the power voltage VDD to the fifth PMOS transistor P5. The fifth PMOS transistor P5 is gated by the signal level of the clock signal CK to provide an output of the fourth PMOS transistor P4 to the feedback node FB. That is, the fourth PMOS transistor P4 and the fifth PMOS transistor P5 may be connected between the power voltage VDD and the feedback node FB in series.

The sixth PMOS transistor P6 is gated by an output of the fifth logical gate G5 to provide the power voltage VDD to the fifth PMOS transistor P5. That is, the sixth PMOS transistor P6 and the fifth PMOS transistor P5 may also be connected between the power voltage VDD and the feedback node FB in series.

The first NMOS transistor N1 is gated by the signal level of the low-voltage mode signal LV to provide an output of the third NMOS transistor N3 to the sensing node S. The second NMOS transistor N2 is gated by the signal level of the enable signal E to provide the output of the third NMOS transistor N3 to the sensing node S. That is, the first NMOS transistor N1 and the second NMOS transistor N2 may be connected between the third NMOS transistor N3 and the sensing node S in parallel.

The third NMOS transistor N3 is gated by the signal level of the clock signal CK to provide an output of the fourth NMOS transistor N4 to the first NMOS transistor N1 and the second NMOS transistor N2. The fourth NMOS transistor N4 is gated by the voltage level of the feedback node FB to provide ground voltage VSS to the third NMOS transistor N3. When arranged, the fourth NMOS transistor N4, the third NMOS transistor N3, and the first NMOS transistor N1 may be connected between the ground voltage VSS and the sensing node S in series, and the fourth NMOS transistor N4, the third NMOS transistor N3, and the second NMOS transistor N2 may also be connected between the ground voltage VSS and the sensing node S in series.

The fifth NMOS transistor N5 is gated by an output of the second logical gate G2 to connect the sensing node S and the ninth NMOS transistor N9. The sixth NMOS transistor N6 is gated by an output of the third logical gate G3 to connect the feedback node FB and the ninth NMOS transistor N9.

The seventh NMOS transistor N7 is gated by the voltage level of the sensing node S to provide an output of the eighth NMOS transistor N8 to the feedback node FB. The eighth NMOS transistor N8 is gated by an output of the fourth logical gate G4 to connect the ninth NMOS transistor N9 and the seventh NMOS transistor N7. The ninth NMOS transistor N9 is gated by the signal level of the clock signal CK to provide the ground voltage VSS to the eighth NMOS transistor N8, the sixth NMOS transistor N6, and the fifth NMOS transistor N5. When arranged, the seventh to ninth NMOS transistors N7 to N9 may be connected between the feedback node FB and the ground voltage VSS in series, the sixth and ninth NMOS transistors N6 and N9 may also be connected between the feedback node FB and the ground voltage VSS in series, and the fifth and ninth NMOS transistors N5 and N9 may be connected between the sensing node S and the ground voltage VSS in series.

The tenth NMOS transistor N10 is gated by the signal level of the low-voltage mode signal LV to provide an output of the eleventh NMOS transistor N11 to the seventh NMOS transistor N7. The eleventh NMOS transistor N11 is gated by the output of the fifth logical gate G5 to provide the ground voltage VSS to the tenth NMOS transistor N10. That is, the seventh NMOS transistor N7, the tenth NMOS transistor N10, and the eleventh NMOS transistor N11 may be connected between the ground voltage VSS and the feedback node FB in series.

The first logical gate G1 may be, for example, an inverter that inverts the voltage level of the sensing node S to provide the inverted voltage level to an output node. The second logical gate G2 may be, for example, an inverter that inverts the voltage level of the sensing node S to provide the inverted voltage level to a gate terminal of the fifth NMOS transistor N5. The third logical gate G3 may be, for example, an inverter that inverts the voltage level of the feedback node FB to provide the inverted voltage level to a gate terminal of the sixth NMOS transistor N6. The fourth logical gate G4 may be, for example, a NOR gate that NOR-operates the signal level of the low-voltage mode signal LV and the signal level of the enable signal E and outputs the operation result. The fifth logical gate G5 may be, for example, a NOR gate that NOR-operates the signal level of the scan enable signal SE and the signal level of the enable signal E and outputs the operation result.

The semiconductor circuit 4 according to the present embodiment has been described with reference to FIG. 6 as above, but the inventive concept is not limited thereto. A plurality of PMOS transistors P1 to P6 illustrated in FIG. 6 may be substituted with a plurality of NMOS transistors as necessary. Further, a plurality of NMOS transistors N1 to N11 illustrated in FIG. 6 may be substituted with a plurality of PMOS transistors as necessary.

FIGS. 7 to 12 are diagrams for describing an operation of the semiconductor circuit illustrated in FIG. 6.

Figure 7:
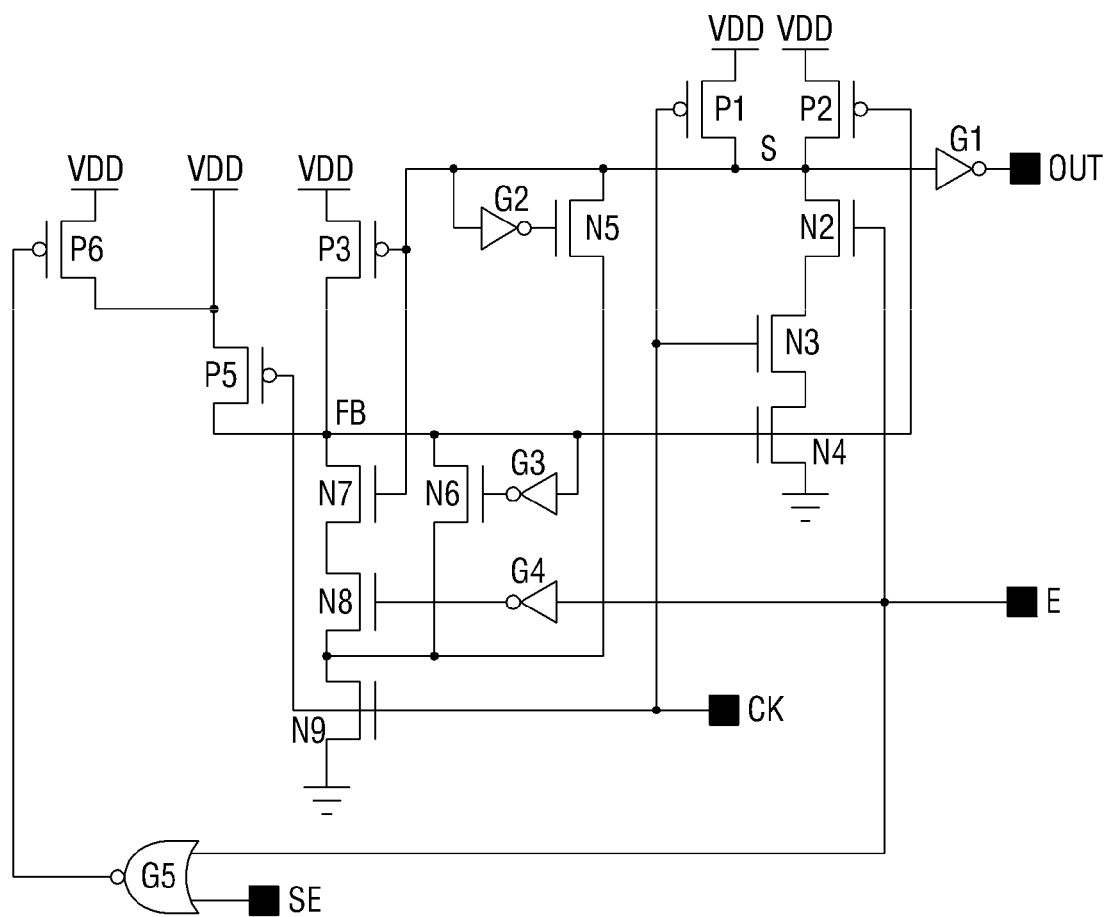
FIGS. 7 to 12 are diagrams for describing an operation of the semiconductor circuit illustrated in FIG. 6, according to exemplary embodiments.

First, FIG. 7 is a diagram illustrating a circuit diagram when the semiconductor circuit 4 of FIG. 6 operates in the high-voltage mode. As described above, in the high-voltage mode, since the signal level of the low-voltage mode signal LV of FIG. 6 is the first level L, the circuit of FIG. 6 may be implemented as the circuit illustrated in FIG. 7.

Figure 8:
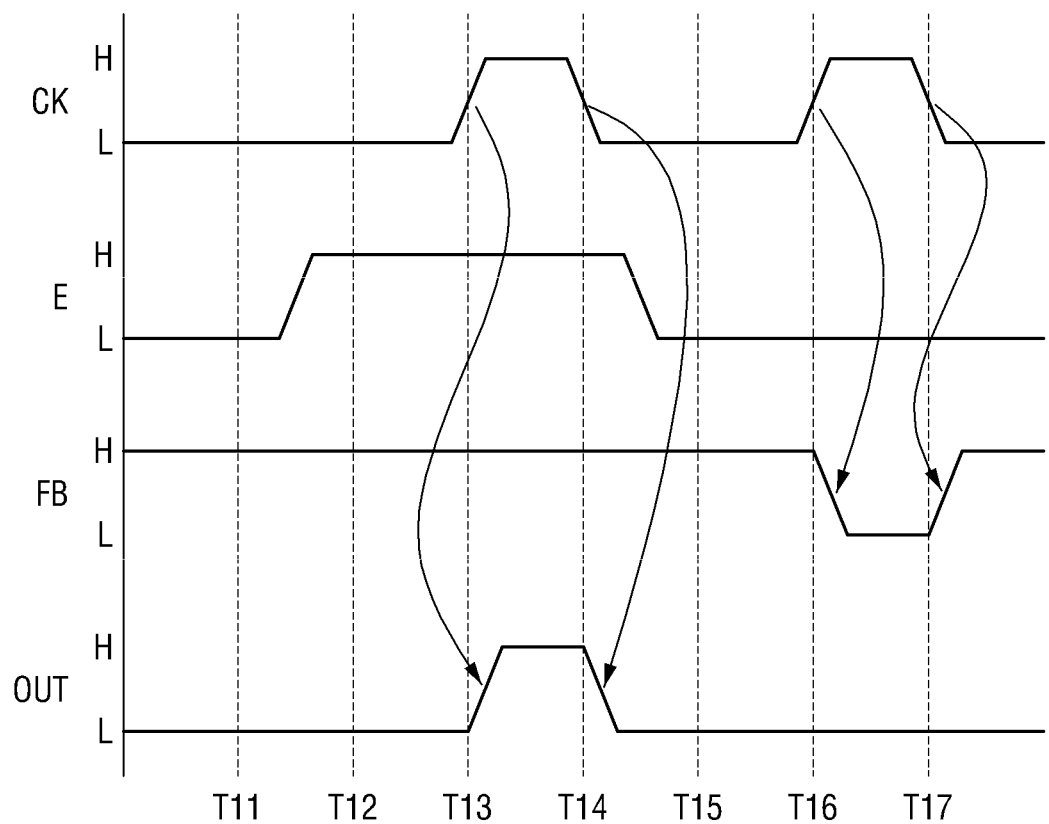

Referring to FIGS. 7 and 8, first, at a first time T11, since the signal level of the clock signal CK is the first level L, the ninth NMOS transistor N9 is turned off and the fifth PMOS transistor P5 is turned on. As a result, the power voltage VDD is supplied to the feedback node FB and the voltage level of the feedback node FB is maintained at the second level H. When the voltage level of the feedback node FB is the second level H, the sixth NMOS transistor N6 is turned off and the fourth NMOS transistor N4 is turned on.

Since the signal level of the clock signal CK is the first level L, the third NMOS transistor N3 is turned off and the first PMOS transistor P1 is turned on. As a result, the power voltage VDD is supplied to the sensing node S and the voltage level of the sensing node S is maintained at the second level H. When the voltage level of the sensing node S is the second level H, a signal level of an output signal OUT output to an output node becomes the first level L.

Since the voltage level of the sensing node S is the second level H, the fifth NMOS transistor N5 is turned off. In addition, the seventh NMOS transistor N7 is turned on.

Further, at the first time T11, since the enable signal E is at the first level L, the eighth NMOS transistor N8 is turned on. However, since the ninth NMOS transistor N9 is turned off, the eighth NMOS transistor N8 is not able to transfer the ground voltage VSS to the feedback node FB through the seventh NMOS transistor N7. Therefore, the voltage level of the feedback node FB is maintained at the second level H. Further, since the enable signal E is at the first level L, the second NMOS transistor N2 is turned off.

As known in FIG. 7, since the signal level of the low-voltage mode signal (LV of FIG. 6) is the first level L, the power voltage VDD is provided to the fifth PMOS transistor P5 regardless of turn-on or turn-off of the sixth PMOS transistor P6. In other words, the power voltage VDD is provided to the fifth PMOS transistor P5 regardless of the output of the fifth logical gate G5. This means that when the semiconductor circuit 4 of FIG. 6 according to the aforementioned embodiment operates in the high-voltage mode, the signal level of the scan enable signal SE is irrespective of or does not affect the operation of the semiconductor circuit 4 of FIG. 6.

Next, at a second time T12, as the enable signal E is changed to the second level H, the eighth NMOS transistor N8 is turned off and the second NMOS transistor N2 is turned on. However, since the third NMOS transistor N3 is turned off, the voltage level of the sensing node S is not changed.

Next, at a third time T13, the signal level of the clock signal CK is transited from the first level L to the second level H. As a result, the ninth NMOS transistor N9 is turned on and the fifth PMOS transistor P5 is turned off. Although the ninth NMOS transistor N9 is turned on, since the eighth NMOS transistor N8 is turned off, the ground voltage VSS is not provided to the feedback node FB.

Since the signal level of the clock signal CK is transited to the second level H, the third NMOS transistor N3 is turned on and the first PMOS transistor P1 is turned off. As a result, the ground voltage VSS is supplied to the sensing node S through the second to fourth NMOS transistors N2 to N4. Therefore, the voltage level of the sensing node S is changed to the first level L. When the voltage level L of the sensing node S is changed to the first level L as above, the signal level of the output signal OUT output to the output node is changed to the second level H.

Since the voltage level of the sensing node S is changed to the first level L, the fifth NMOS transistor N5 is turned on. As a result, the ground voltage VSS is supplied to the sensing node S through the ninth NMOS transistor N9 and the fifth NMOS transistor N5. In addition, since the voltage level of the sensing node S is changed to the first level L, the third PMOS transistor P3 is turned on. As a result, the power voltage VDD is provided to the feedback node FB. In addition, since the voltage level of the sensing node S is changed to the first level L, the seventh NMOS transistor N7 is turned off.

Next, at a fourth time T14, the signal level of the clock signal CK is transited from the second level H to the first level L. As a result, the ninth NMOS transistor N9 is turned off and the fifth PMOS transistor P5 is turned on. As a result, the power voltage VDD is supplied to the feedback node FB and the voltage level of the feedback node FB is maintained at the second level H.

Since the signal level of the clock signal CK is transited to the first level L, the third NMOS transistor N3 is turned off and the first PMOS transistor P1 is turned on. As a result, since the power voltage VDD is supplied to the sensing node S and the third NMOS transistor N3 is turned off, the voltage level of the sensing node S is changed to the second level H. When the voltage level of the sensing node S is changed to the second level H as above, the signal level of the output signal OUT output to the output node is changed to the first level L.

Since the voltage level of the sensing node S is changed to the second level H, the fifth NMOS transistor N5 is turned off, the third PMOS transistor P3 is turned off, and the seventh NMOS transistor N7 is turned on. However, since the ninth NMOS transistor N9 is turned off, the voltage level of the feedback node FB is not changed.

Next, at a fifth time T15, as the enable signal E is changed to the first level L, the eighth NMOS transistor N8 is turned on and the second NMOS transistor N2 is turned off. However, since the ninth NMOS transistor N9 is turned off, the voltage level of the feedback node FB is not changed.

Next, at a sixth time T16, the signal level of the clock signal CK is transited from the first level L to the second level H. As a result, the ninth NMOS transistor N9 is turned on and the fifth PMOS transistor P5 is turned off. When the ninth NMOS transistor N9 is turned on, the ground voltage VSS is supplied to the feedback node FB through the seventh to ninth NMOS transistors N7 to N9. Therefore, the voltage level of the feedback node FB is changed to the first level L.

Since the signal level of the clock signal CK is transited to the second level H, the third NMOS transistor N3 is turned on and the first PMOS transistor P1 is turned off. However, since the second NMOS transistor N2 is turned off, the ground voltage VSS is not supplied to the sensing node S. Therefore, the voltage level of the sensing node S is maintained at the second level H. When the voltage level of the sensing node S is maintained at the second level H as above, the signal level of the output signal OUT output to the output node is maintained at the first level L.

Next, at a seventh time T17, the signal level of the clock signal CK is transited from the second level H to the first level L. As a result, the ninth NMOS transistor N9 is turned off and the fifth PMOS transistor P5 is turned on. As a result, the power voltage VDD is supplied to the feedback node FB and the voltage level of the feedback node FB is changed to the second level H.

As described above, in the semiconductor circuit 4 according to the aforementioned embodiment, when the semiconductor circuit 4 operates in the high-voltage mode, the enable clock signal ECK corresponding to the clock signal CK is output to the output node while the signal level of the enable signal E is the second level H regardless of the signal level of the scan enable signal SE.

Figure 9:
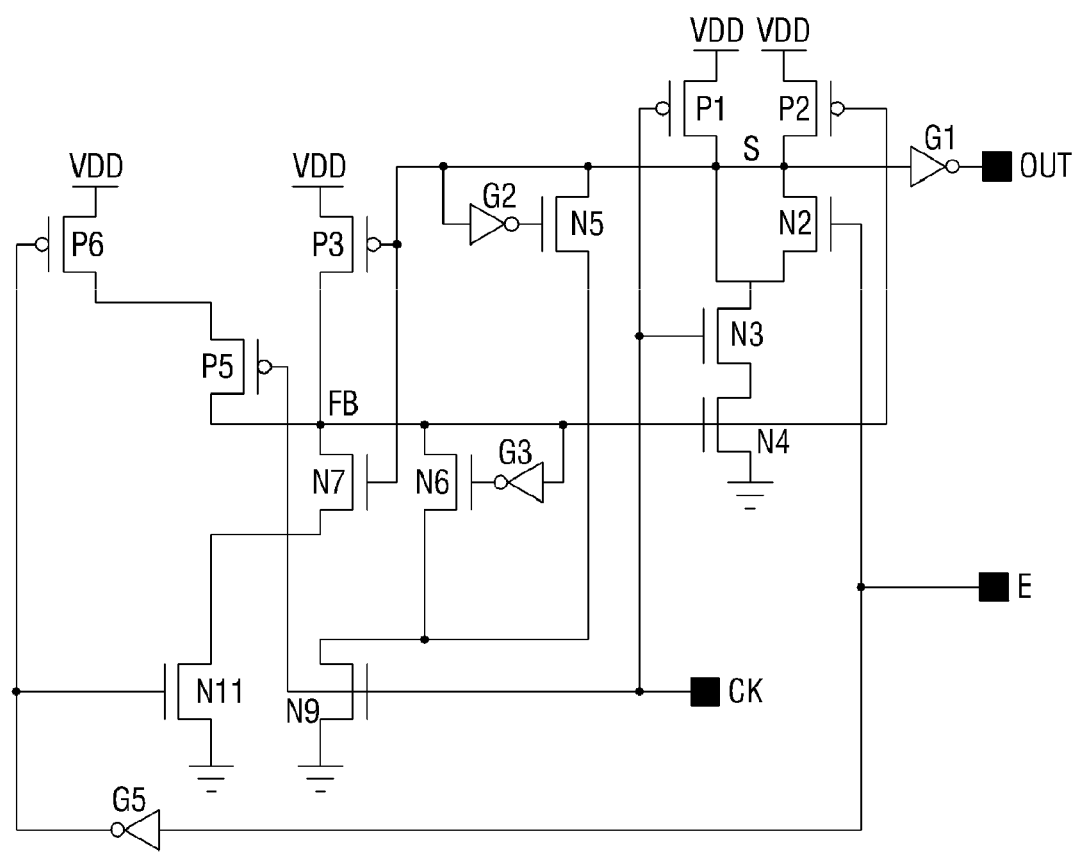

Next, FIG. 9 is a diagram illustrating a circuit diagram when the semiconductor circuit 4 FIG. 6 normally operates in the low-voltage mode. As described above, when the semiconductor circuit 4 of FIG. 6 operates normally in the low-voltage mode, the signal level of the low-voltage mode signal LV of FIG. 6 is the second level H and the signal level of the scan enable signal SE is the first level L, and as a result, the circuit of FIG. 6 may be implemented as the circuit illustrated in FIG. 9.

Figure 10:
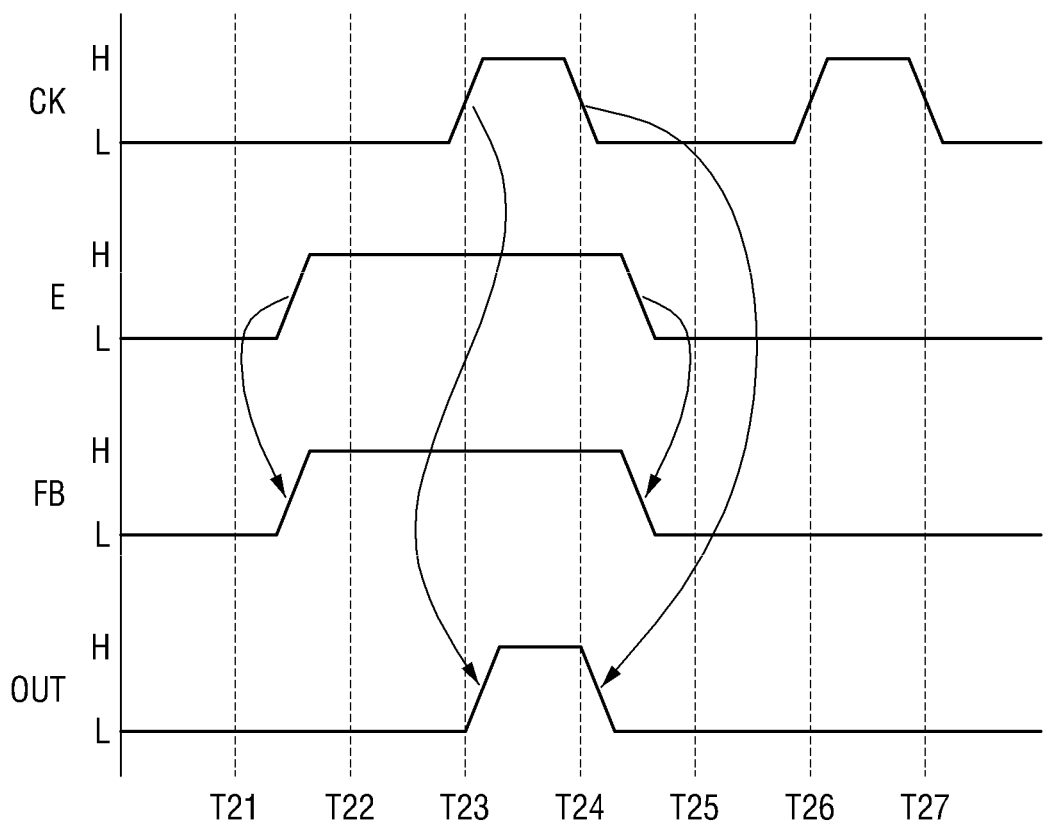

Referring to FIGS. 9 and 10, first, at a first time T21, since the signal level of the enable signal E is the first level L, the eleventh NMOS transistor N11 is turned on and the sixth PMOS transistor P6 is turned off. In addition, since the signal level of the enable signal E is the first level L, the second NMOS transistor N2 is turned off.

At the first time T21, since the signal level of the clock signal CK is the first level L, the ninth NMOS transistor N9 is turned off and the fifth PMOS transistor P5 is turned on. Since the signal level of the enable signal E is also the first level L, the sixth PMOS transistor P6 is turned off. In addition, since the signal level of the clock signal CK is the first level L, the third NMOS transistor N3 is turned off and the first PMOS transistor P1 is turned on. As a result, the power voltage VDD is supplied to the sensing node S through the first PMOS transistor P1, and as a result, the voltage level of the sensing node S is maintained at the second level H. When the voltage level of the sensing node S is the second level H, the signal level of the output signal OUT output to the output node becomes the first level L.

Since the voltage level of the sensing node S is the second level H, the fifth NMOS transistor N5 and the third PMOS transistor P3 are turned off. In addition, the seventh NMOS transistor N7 is turned on. As a result, the ground voltage VSS is supplied to the feedback node FB through the seventh NMOS transistor N7 and the eleventh NMOS transistor N11. Therefore, the voltage level of the feedback node FB is maintained at the first level L.

When the voltage level of the feedback node FB is maintained at the first level L, the fourth NMOS transistor N4 is turned off and the second PMOS transistor P2 is turned on. As a result, the power voltage VDD is supplied to the sensing node S through the second PMOS transistor P2.

Next, at a second time T22, as the enable signal E is changed to the second level H, the eleventh NMOS transistor N11 is turned off and the second NMOS transistor N2 and the sixth PMOS transistor P6 are turned on. Herein, although the second NMOS transistor N2 is turned on, since the third NMOS transistor N3 is turned off, the voltage level of the sensing node S is not changed. On the contrary, when the sixth PMOS transistor P6 is turned on, the fifth PMOS transistor P5 is turned on, and as a result, the power voltage VDD is provided to the feedback node FB through the fifth and sixth PMOS transistors P5 and P6. Therefore, the voltage level of the feedback node FB is changed to the second level H.

When the voltage level of the feedback node FB is changed to the second level H as above, the sixth NMOS transistor N6 is turned off. In addition, when the voltage level of the feedback node FB is changed to the second level H, the fourth NMOS transistor N4 is turned on and the second PMOS transistor P2 is turned off. However, the sensing node S still receives the power voltage VDD through the first PMOS transistor P1, and is not connected to the ground voltage VSS because the third NMOS transistor N3 is turned off, and as a result, the sensing node S is still maintained at the second level H.

Next, at a third time T23, the signal level of the clock signal CK is transited from the first level L to the second level H. As a result, the ninth NMOS transistor N9 is turned on and the fifth PMOS transistor P5 is turned off. In addition, the third NMOS transistor N3 is turned on and the first PMOS transistor P1 is turned off. As a result, the ground voltage VSS is supplied to the sensing node S through the second to fourth NMOS transistors N2 to N4. Therefore, the voltage level of the sensing node S is changed to the first level L. When the voltage level of the sensing node S is changed to the first level L as above, the signal level of the output signal OUT output to the output node is changed to the second level H.

Since the voltage level of the sensing node S is changed to the first level L, the fifth NMOS transistor N5 is turned on. As a result, the ground voltage VSS is supplied to the sensing node S through the ninth NMOS transistor N9 and the fifth NMOS transistor N5. In addition, since the voltage level of the sensing node S is changed to the first level L, the third PMOS transistor P3 is turned on. As a result, the power voltage VDD is provided to the feedback node FB. Therefore, the voltage level of the feedback node FB is maintained at the second level H. In addition, since the voltage level of the sensing node S is changed to the first level L, the seventh NMOS transistor N7 is turned off.

Next, at a fourth time T24, the signal level of the clock signal CK is transited from the second level H to the first level L. As a result, the ninth NMOS transistor N9 is turned off and the fifth PMOS transistor P5 is turned on. As a result, the power voltage VDD is supplied to the feedback node FB and the voltage level of the feedback node FB is maintained at the second level H.

Since the signal level of the clock signal CK is transited to the first level L, the third NMOS transistor N3 is turned off and the first PMOS transistor P1 is turned on. As a result, since the power voltage VDD is supplied to the sensing node S and the third NMOS transistor N3 is turned off, the voltage level of the sensing node S is changed to the second level H. When the voltage level of the sensing node S is changed to the second level H as above, the signal level of the output signal OUT output to the output node is changed to the first level L.

Since the voltage level of the sensing node S is changed to the second level H, the fifth NMOS transistor N5 is turned off, the third PMOS transistor P3 is turned off, and the seventh NMOS transistor N7 is turned on. However, since the eleventh NMOS transistor N11 is turned off, the voltage level of the feedback node FB is not changed.

Next, at a fifth time T25, as the enable signal E is changed to the first level L, the eleventh NMOS transistor N11 is turned on. As a result, the ground voltage VSS is supplied to the feedback node FB through the seventh NMOS transistor N7 and the eleventh NMOS transistor N11. Therefore, the voltage level of the feedback node FB is changed to the first level L. However, as the signal level of the enable signal E is changed to the first level L, the sixth PMOS transistor P6 is turned off.

Next, at a sixth time T26, the signal level of the clock signal CK is transited from the first level L to the second level H. As a result, the ninth NMOS transistor N9 is turned on and the fifth PMOS transistor P5 is turned off. When the ninth NMOS transistor N9 is turned on, the ground voltage VSS is supplied to the feedback node FB. Therefore, the voltage level of the feedback node FB is maintained at the first level L.

Since the signal level of the clock signal CK is transited to the second level H, the third NMOS transistor N3 is turned on and the first PMOS transistor P1 is turned off. However, since the fourth NMOS transistor N4 is turned off, the ground voltage VSS is not supplied to the sensing node S. In addition, the power voltage VDD is supplied to the sensing node S by the second PMOS transistor P2. Therefore, the voltage level of the sensing node S is maintained at the second level H. When the voltage level of the sensing node S is maintained at the second level H as above, the signal level of the output signal OUT output to the output node is maintained at the first level L.

Next, at a seventh time T27, the signal level of the clock signal CK is transited from the second level H to the first level L. As a result, the ninth NMOS transistor N9 is turned off and the fifth PMOS transistor P5 is turned on. However, since the sixth PMOS transistor P6 is turned off, the feedback node FB is maintained at the first level L.

As described above, in the semiconductor circuit 4 of FIG. 6 according to the aforementioned embodiment, when the semiconductor circuit 4 operates normally in the low-voltage mode, since the signal level of the scan enable signal SE is the first level L, the enable clock signal ECK corresponding to the clock signal is output to the output node while the signal level of the enable signal E is the second level H.

Figure 11:
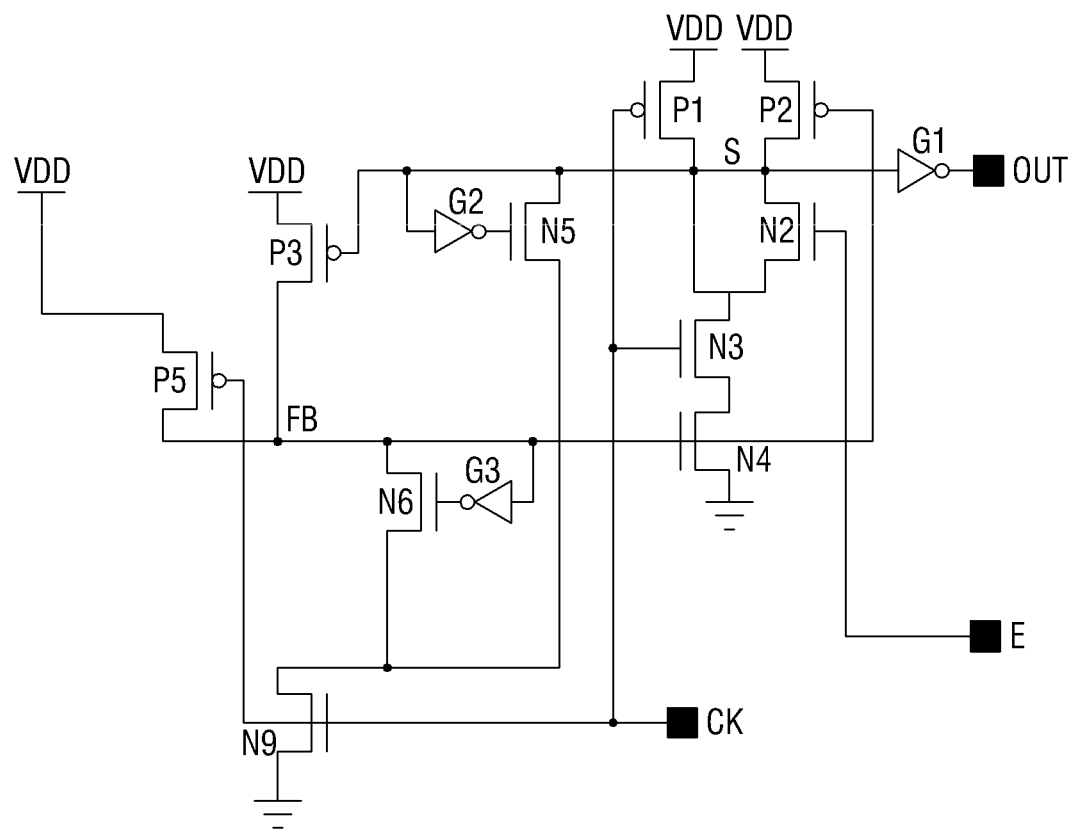

Next, FIG. 11 is a diagram illustrating a circuit diagram when the semiconductor circuit 4 of FIG. 6 performs a scan operation in the low-voltage mode. As described above, when the semiconductor circuit 4 of FIG. 6 performs the scan operation in the low-voltage mode, both the signal level of the low-voltage mode signal LV of FIG. 6 and the signal level of the scan enable signal SE are the second level H, and as a result, the circuit of FIG. 6 may be implemented as the circuit illustrated in FIG. 11.

Figure 12:
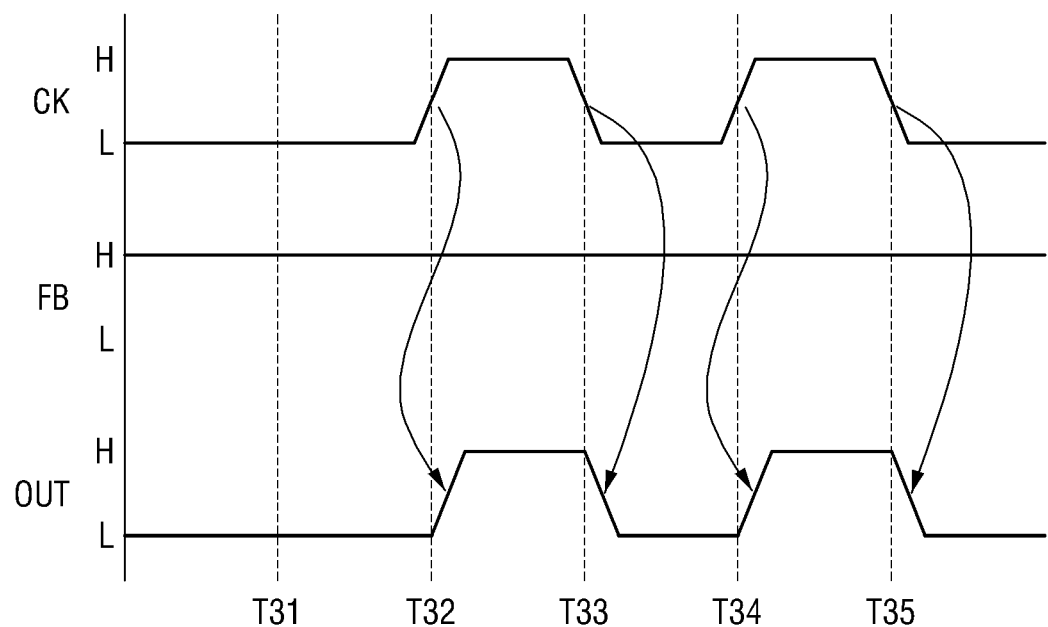

Referring to FIGS. 11 and 12, first, at a first time T31, since the signal level of the clock signal CK is the first level L, the ninth NMOS transistor N9 is turned off and the fifth PMOS transistor P5 is turned on. As a result, the power voltage VDD is supplied to the feedback node FB and the voltage level of the feedback node FB is maintained at the second level H. When the voltage level of the feedback node FB is the second level H as above, the sixth NMOS transistor N6 and the second PMOS transistor P2 are turned off and the fourth NMOS transistor N4 is turned on.

Since the signal level of the clock signal CK is the first level L, the third NMOS transistor N3 is turned off and the first PMOS transistor P1 is turned on. As a result, the power voltage VDD is supplied to the sensing node S and the voltage level of the sensing node S is maintained at the second level H. When the voltage level of the sensing node S is the second level H, a signal level of an output signal OUT output to an output node becomes the first level L.

Since the voltage level of the sensing node S is the second level H, the fifth NMOS transistor N5 and the third PMOS transistor P3 are turned off.

Next, at a second time T32, the signal level of the clock signal CK is transited from the first level L to the second level H. As a result, the ninth NMOS transistor N9 is turned on and the fifth PMOS transistor P5 is turned off.

Since the signal level of the clock signal CK is transited to the second level H, the third NMOS transistor N3 is turned on and the first PMOS transistor P1 is turned off. As a result, the ground voltage VSS is supplied to the sensing node S through the third and fourth NMOS transistors N3 and N4. Therefore, the voltage level of the sensing node S is changed to the first level L. When the voltage level of the sensing node S is changed to the first level L as above, the signal level of the output signal OUT output to the output node is changed to the second level H.

Since the voltage level of the sensing node S is changed to the first level L, the fifth NMOS transistor N5 is turned on. As a result, the ground voltage VSS is supplied to the sensing node S through the ninth NMOS transistor N9 and the fifth NMOS transistor N5. In addition, since the voltage level of the sensing node S is changed to the first level L, the third PMOS transistor P3 is turned on. As a result, the power voltage VDD is provided to the feedback node FB. Therefore, the voltage level of the feedback node FB is maintained at the second level H.

Next, at a third time T33, the signal level of the clock signal CK is transited from the second level H to the first level L. As a result, the ninth NMOS transistor N9 is turned off and the fifth PMOS transistor P5 is turned on. As a result, the power voltage VDD is supplied to the feedback node FB and the voltage level of the feedback node FB is maintained at the second level H.

Since the signal level of the clock signal CK is transited to the first level L, the third NMOS transistor N3 is turned off and the first PMOS transistor P1 is turned on. As a result, since the power voltage VDD is supplied to the sensing node S and the third NMOS transistor N3 is turned off, the voltage level of the sensing node S is changed to the second level H. When the voltage level of the sensing node S is changed to the second level H as above, the signal level of the output signal OUT output to the output node is changed to the first level L.

Since the voltage level of the sensing node S is changed to the second level H, the fifth NMOS transistor N5 and the third PMOS transistor P3 are turned off.

The same operation as the second time T32 is repeated at a fourth time T34 and the same operation as the third time T33 is repeated at a fifth time T35, as illustrated next.

In the case of the scan operation in which the signal level of the scan enable signal SE is maintained at the second level H, the semiconductor circuit 4 of FIG. 6 outputs the enable clock signal CK corresponding to the clock signal CK regardless of the signal level of the enable signal E. In more detail, as the signal level of the enable signal E is changed, a transistor which is turned on or off is the second NMOS transistor N2. However, as illustrated in FIG. 11, since the sensing node S is directly connected to the third NMOS transistor N3, the signal level of the enable signal E does not affect the operation of the semiconductor circuit.

The aforementioned operation of the semiconductor circuit 4 of FIG. 6 will be summarized below.

First, in the high-voltage mode in which the signal level of the low-voltage mode signal LV is the first level L, the semiconductor circuit 4 of FIG. 6 outputs the enable clock signal ECK corresponding to the clock signal CK while the signal level of the enable signal E is the second level H regardless of the signal level of the scan enable signal SE.

In addition, in the low-voltage mode in which the signal level of the low-voltage mode signal LV is the second level H, the semiconductor circuit 4 of FIG. 6 outputs the enable clock signal ECK corresponding to the clock signal CK while the signal level of at least one of the scan enable signal SE and the enable signal E is the second level H. In detail, in the normal operation in which the signal level of the scan enable signal SE is the first level L, the semiconductor circuit 4 of FIG. 6 outputs the enable clock signal ECK corresponding to the clock signal CK while the signal level of the enable signal E is the second level H. In addition, in the scan operation in which the signal level of the scan enable signal SE is the second level H, the semiconductor circuit 4 of FIG. 6 outputs the enable clock signal ECK corresponding to the clock signal CK regardless of the signal level of the enable signal E.

Next, referring to FIG. 13, an exemplary electronic system which may adopt the semiconductor circuit according to the aforementioned embodiments will be described.

Figure 13:
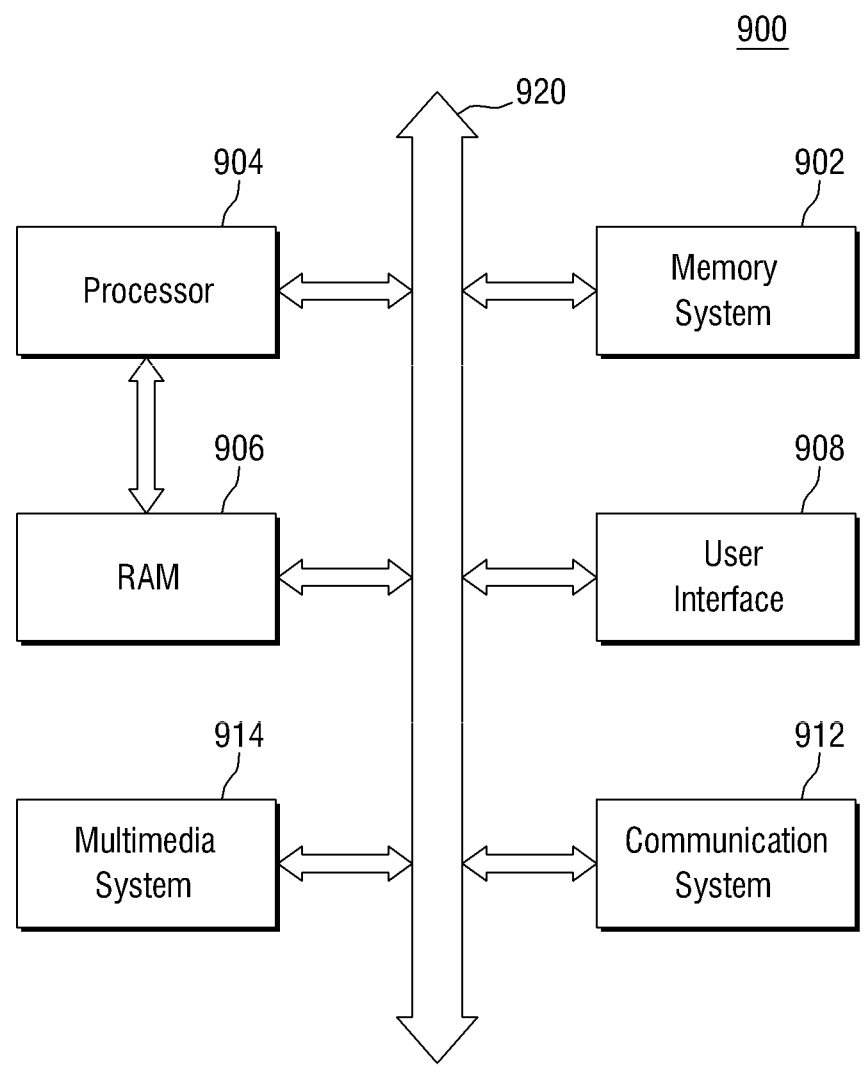
FIG. 13 is a block diagram illustrating a configuration of an exemplary electronic system adopting the semiconductor circuit according to the above exemplary embodiments.

FIG. 13 is a block diagram illustrating a configuration of an exemplary electronic system adopting the semiconductor circuit according to the aforementioned embodiments.

Referring to FIG. 13, an electronic system 900 may include a memory system 902, a processor 904, a random access memory (RAM) 906, a user interface 908, a communication system 912, and a multimedia system 914.

The memory system 902, the processor 904, the RAM 906, the user interface 908, the communication system 912, and the multimedia system 914 may communicate data with each other by using, for example, a bus 920. In some embodiments, the bus 920 may be, for example, a multi-layer bus, but the present invention is not limited thereto.

The processor 904 may serve to execute a program and control the electronic system 900. The processor 904 may include at least one microprocessor, a digital signal processor, a microcontroller, and at least one of logic elements that may perform similar functions thereto. According to an exemplary embodiment, the processor 904 may include operating caches such as L1 and L2 in order to improve an operating speed.

The RAM 906 may be used as an operating memory of the processor 904. The RAM 906 may be formed by, for example, a volatile memory such as a Dynamic RAM (DRAM).

The processor 904 and the RAM 906 may be implemented by one semiconductor device or by being packaged as a semiconductor package. In some embodiments, the processor 904 and the RAM 906 may be implemented by being packaged in a package on package (PoP) form, but the present invention is not limited thereto.

The user interface 908 may be used to input or output data into or to the electronic system 900. Examples of the user interface 908 may include a key pad, a keyboard, a touch sensor, and a display device. Each user interface 906 may be implemented as an independent system in the electronic system 900. For example, the keypad, the keyboard, and the touch sensor may be implemented as an input system and the display device may be implemented as a display system. The display system may include a data driving IC (DDIC) for driving the display device, and the like.

The memory system 902 may include one or more non-volatile memory devices for storing a code for an operation of the processor 904, data processed by the processor 904, or data input from the outside. The memory system 902 may include a separate controller for driving.

The controller may be configured to connect a host and the non-volatile memory device. The controller may be configured to access the non-volatile memory device in response to a request from the host. For example, the controller may be configured to control reading, writing, erasing, and background operations of the non-volatile memory device.

The controller may be configured to provide an interface between the non-volatile memory device and the host. Further, the controller may be configured to drive firmware for controlling the non-volatile memory device.

For example, the controller may further include well-known constituent elements, such as a RAM, a processing unit, a host interface, and a memory interface. The RAM may be used as at least one among a working memory of the processing unit, a cache memory between the nonvolatile memory device and the host, and a buffer memory between the nonvolatile memory device and the host. The processing unit may control all operations of the controller.

The host interface may include a protocol for exchanging data between the host and the controller. For example, the controller may be configured to communicate with the outside (host) through at least one of various interface protocols, such as a universal serial bus (USB) protocol, a multimedia card (MMC) protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, and an integrated drive electronics (IDE) protocol. The memory interface may interface with the non-volatile memory device. For example, the memory interface may include a NAND interface or a NOR interface.

The memory system 902 may be configured to additionally include an error correction block. The error correction block may be configured to detect and correct an error of data stored from the memory system 902 by using an error correction code (ECC). For example, the error correction block may be provided as a component of the aforementioned controller. However, the present invention is not limited thereto and the error correction block may be provided as a component of the non-volatile memory device.

In an information processing system such as a mobile apparatus or a desktop computer, a flash memory which is one example of the non-volatile memory may be mounted on the memory system 902. The flash memory may be configured in a form of a solid state drive (SSD). In this case, the electronic system 900 may stably store large-capacity data in the flash memory.

The memory system 902 may be integrated in one semiconductor device. For example, the memory system 902 is integrated in one semiconductor device to configure a memory card. For example, the memory system 902 is integrated as one semiconductor device to configure a memory card, such as a PC card (personal computer memory card international association (PCMCIA)), a compact flash (CF) card, smart media cards (SM, SMC), a memory stick, multimedia cards (MMC, RS-MMC, and MMCmicro), SD cards (SD, miniSD, microSD, and SDHC), and a universal flash storage (UFS).

For example, the memory system 902 may be installed as various types of packages. For example, the memory system 902 may be packaged by a method, such as package on package (PoP), ball grid arrays (BGAs), chip scale packages (CSPs), plastic leaded chip carrier (PLCC), plastic dual in line package (PDIP), die in waffle pack, die in wafer form, chip on board (COB), ceramic dual in line package (CERDIP), plastic metric quad flat pack (MQFP), thin quad flat pack (TQFP), small outline (SOIC), shrink small outline package (SSOP), thin small outline (TSOP), thin quad flat pack (TQFP), system in package (SIP), multi-chip package (MCP), wafer-level fabricated package (WFP), and wafer-level processed stack package (WSP).

The communication system 912 may be a system that processes a communication process between the electronic system 900 and the outside. The multimedia system 914 may be a system that performs various types multimedia processing in the electronic system 900. The multimedia system 914 may include, for example, a graphic engine, a video codec, a camera module, and the like.

The semiconductor circuits 1 to 4 according to the aforementioned embodiments may be adopted as one component of the aforementioned various systems and modules.

Figure 14:
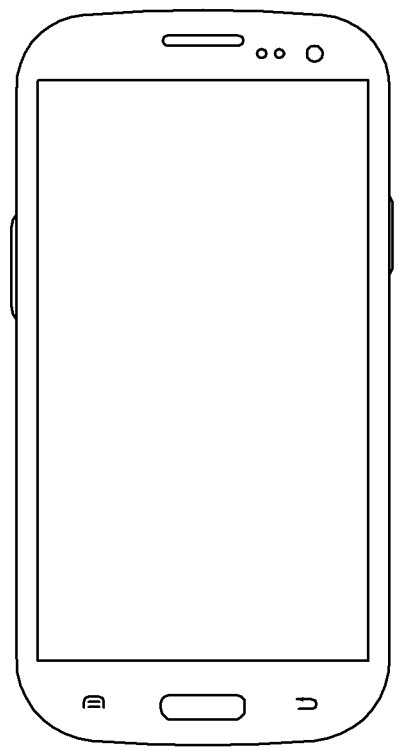
FIG. 14 is a diagram illustrating an example in which the electronic system of FIG. 13 is applied to a smart phone, according to an exemplary embodiment.

The electronic system 900 illustrated in FIG. 13 may be applied to electronic control devices of various electronic apparatuses. FIG. 14 is a diagram illustrating an example in which the electronic system 900 of FIG. 13 is applied to a smart phone 1000. Like this, when the electronic system 900 of FIG. 13 is applied to the smart phone 1000, the electronic system 900 of FIG. 13 or a part of the electronic system 900 of FIG. 13 may be an application processor (AP) implemented in a form of a system on chip (SoC).

Figure 15:
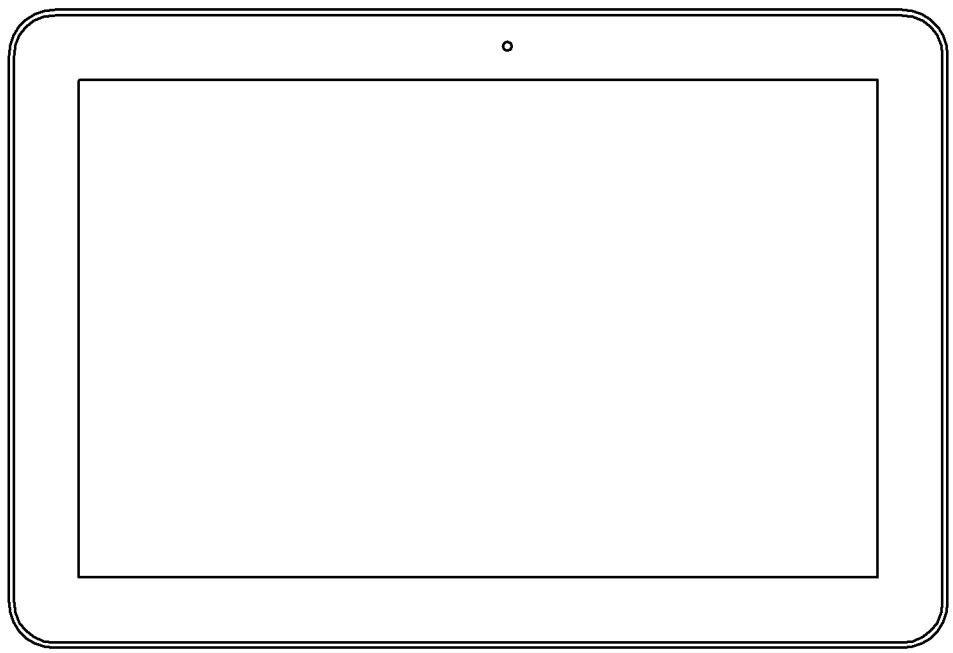
FIG. 15 is a diagram illustrating an example in which the electronic system of FIG. 13 is applied to a tablet PC.
Figure 16:
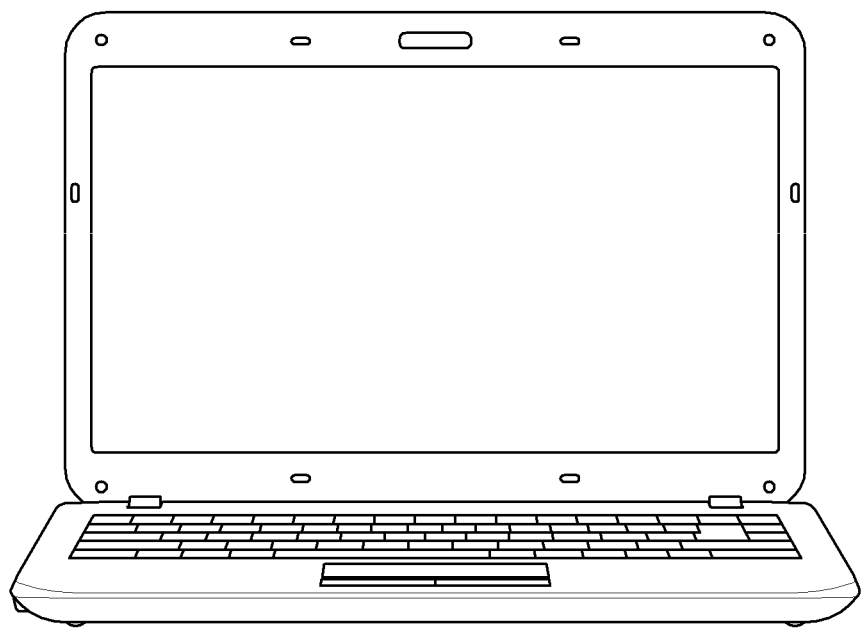
FIG. 16 is a diagram illustrating an example in which the electronic system of FIG. 13 is applied to a notebook.

The electronic system 900 of FIG. 13 may be adopted in various other electronic apparatuses. FIG. 15 is a diagram illustrating an example in which the electronic system 900 of FIG. 13 is applied to a tablet PC 1100. FIG. 16 is a diagram illustrating an example in which the electronic system 900 of FIG. 13 is applied to a notebook 1200.

Besides, the electronic system 900 of FIG. 13 may be provided as one of various constituent elements of an electronic device, such as a personal computer, an ultra-mobile PC (UMPC), a workstation, a net-book computer, personal digital assistants (PDA), a portable computer, a web tablet PC, a wireless phone, a mobile phone, an e-book reader, a portable multimedia player (PMP), a portable game device, a navigation device, a black box, a digital camera, a 3-dimensional television, a digital audio recorder, a digital audio player, a digital picture recorder, a digital picture player, a digital video recorder, a digital video player, a device capable of transceiving information in a wireless environment, one of various electronic devices configuring a home network, one of various electronic devices configuring a computer network, one of various electronic devices configuring a telematics network, an RFID device, or one of various constituent elements configuring a computing system.

When the electronic system 900 of FIG. 13 is equipment that may perform wireless communication, the electronic system 900 of FIG. 13 may be used in a communication system such as a code division multiple access (CDMA), a global system for mobile communication (GSM), a north American digital cellular (NADC), an enhanced-time division multiple access (E-TDMA), a wideband code division multiple access (WCDMA), and a CDMA2000.

The foregoing is illustrative of the inventive concept and is not to be construed as limiting thereof. Although a few exemplary embodiments have been described, those skilled in the art will readily appreciate that many modifications are possible in the embodiments without materially departing from the novel teachings and advantages of the inventive concept. Accordingly, all such modifications are intended to be included within the scope of the inventive concept as defined in the claims. The inventive concept is defined by the following claims, with equivalents of the claims to be included therein.

What is claimed is:

1. A semiconductor circuit comprising:
    an input node configured to receive an enable signal, a scan enable signal, and a clock signal; and
    a clock gating circuit configured to output an enable clock signal corresponding to the clock signal while a signal level of the enable signal is at a first level regardless of a signal level of the scan enable signal, when the semiconductor circuit is in a high-voltage mode, and output an enable clock signal corresponding to the clock signal while a signal level of at least one of the enable signal and the scan enable signal is at the first level, when the semiconductor circuit is in a low-voltage mode.

2. The semiconductor circuit of claim 1, wherein the input node is further configured to receive a low-voltage mode signal,
    wherein, in the high-voltage mode, a signal level of the low-voltage mode signal is a second level different from the first level, and
    wherein, in the low-voltage mode, the signal level of the low-voltage mode signal is at the first level.

3. The semiconductor circuit of claim 2, wherein the first level is a logical high level, and the second level is a logical low level.

4. The semiconductor circuit of claim 1, wherein the clock gating circuit outputs the enable clock signal corresponding to the clock signal while the signal level of the enable signal is at the first level when performing a normal operation in the low-voltage mode, and outputs the enable clock signal corresponding to the clock signal when performing a scan operation in the low-voltage mode regardless of the signal level of the enable signal.

5. The semiconductor circuit of claim 1, wherein the clock gating circuit comprises a feedback node,
    wherein a voltage level of the feedback node is changed according to a signal level of the clock signal while the signal level of the enable signal is at the second level different from the first level when the clock gating circuit operates in the high-voltage mode,
    wherein the voltage level of the feedback node is changed according to the signal level of the enable signal when the clock gating circuit performs a normal operation in the low-voltage mode, and
    wherein the voltage level of the feedback node is maintained at the first level when the clock gating circuit performs a scan operation in the low-voltage mode.

6. The semiconductor circuit of claim 1, wherein the clock gating circuit includes:
    a clock gating cell;
    a logical operation unit configured to perform a logical operation on the enable signal and the scan enable signal to generate a logical operation signal; and
    a signal selecting unit configured to provide the enable signal to the clock gating cell in the high-voltage mode and provide the logical operation signal to the clock gating cell in the low-voltage mode.

7. The semiconductor circuit of claim 6, wherein the logical operation includes an OR operation, and the logical operation unit includes an OR gate.

8. The semiconductor circuit of claim 6, wherein the signal selecting unit includes a multiplexer configured to perform multiplexing according to a signal level of the low-voltage mode signal.

9. The semiconductor circuit of claim 6, further comprising:
a delay buffer connected to at least one of an input terminal and an output terminal of the logical operation unit.

10. A semiconductor circuit comprising:
a clock gating cell; and
a delay unit configured to delay an enable signal by a first time and provide the delayed signal to the clock gating cell in a high-voltage mode and delay the enable signal by a second time longer than the first time and provide the delayed signal to the clock gating cell in a low-voltage mode.

11. The semiconductor circuit of claim 10, wherein the delay unit delays a logical operation signal generated by performing a logical operation on the enable signal and a scan enable signal by the second time and provides the delayed logical operation signal to the clock gating cell in the low-voltage mode.

12. The semiconductor circuit of claim 10, wherein the delay unit includes:
a logical operation unit configured to perform a logical operation on the enable signal and a scan enable signal to generate a logical operation signal; and
a signal selecting unit configured to provide the enable signal to the clock gating cell when a signal level of a low-voltage mode signal is a first level, and provide the logical operation signal to the clock gating cell when the signal level of the low-voltage mode signal is a second level.

13. The semiconductor circuit of claim 12, wherein the logical operation includes a NOR operation, and the logical operation unit includes a NOR gate.

14. The semiconductor circuit of claim 12, wherein the signal selecting unit includes a multiplexer configured to perform multiplexing according to the signal level of the low-voltage mode signal.

15. The semiconductor circuit of claim 12, further comprising:
a delay buffer connected to at least one of an input terminal and an output terminal of the logical operation unit.

16. A semiconductor circuit comprising a clock gating circuit which comprises:
a first logic gate to which an enable signal and a low-voltage mode signal are input for operation; and
a second logic gate to which the enable signal and a scan enable signal are input for operation,
wherein the clock gating circuit outputs an enable clock signal of a first level according to a clock signal of the clock gating circuit regardless of a signal level of the scan enable signal input to the second logic gate, if the low-voltage mode signal of a second level, opposite to the first level, is input to the first logic gate, and
wherein the clock gating circuit outputs the enable clock signal of the first level according to the clock signal if the low-voltage mode signal of the first level is input to the first logic gate and at least one of the enable signal having the first level and the scan enable signal having the first level is input to the first logic gate and the second logic gate, respectively.

17. The semiconductor circuit of claim 16, wherein the clock gating circuit further comprises a feedback node,
wherein a voltage level of the feedback node is changed according to a signal level of the clock signal if the low-voltage mode signal and the enable signal input to the first logic gate are both at the second level,
wherein the voltage level of the feedback node is changed according to the signal level of the enable signal if the low-voltage mode signal input to the first logic gate is at the first level and the scan enable signal input to the second logic gate is at the second level, and
wherein the voltage level of the feedback node is maintained at the first level if the low-voltage mode signal input to the first logic and the scan enable signal input to the second logic gate are both at the first level.

18. The semiconductor circuit of claim 16, wherein the clock gating circuit outputs the enable clock signal of the first level according to the clock signal regardless of a signal level of the enable signal input to the first logic gate and the second logic gate, if the low-voltage mode signal input to the first logic gate and the scan enable signal input to the second logic gate are both at the first level.

19. The semiconductor circuit of claim 18, wherein the clock gating circuit further comprises a switch configured to receive the enable signal and a ground voltage signal,
wherein the switch is further configured to change a signal level of the enable clock signal by gating the ground voltage signal according to the signal level of the enable signal.

20. The semiconductor circuit of claim 19, wherein the switch comprises an NMOS transistor, and a gate of the NMOS transistor is configured to receive the enable signal.

* * * * *